United States Patent
Xin-LeBlanc

(10) Patent No.: US 8,423,919 B2
(45) Date of Patent: Apr. 16, 2013

(54) UNIVERSAL TWO-INPUT LOGIC GATE THAT IS CONFIGURABLE AND CONNECTABLE IN AN INTEGRATED CIRCUIT BY A SINGLE MASK LAYER ADJUSTMENT

(75) Inventor: Jane Xin-LeBlanc, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 256 days.

(21) Appl. No.: 12/853,488

(22) Filed: Aug. 10, 2010

(65) Prior Publication Data

US 2010/0301901 A1 Dec. 2, 2010

Related U.S. Application Data

(62) Division of application No. 11/005,949, filed on Dec. 7, 2004, now Pat. No. 7,805,701.

(51) Int. Cl.
*G06F 17/50* (2006.01)

(52) U.S. Cl.
USPC .............................................. 716/50; 716/51

(58) Field of Classification Search ............... 716/50–56
See application file for complete search history.

(56) References Cited

U.S. PATENT DOCUMENTS

| | | |
|---|---|---|
| 6,453,447 B1 | 9/2002 | Gardner et al. |
| 6,532,581 B1 | 3/2003 | Toyonaga et al. |
| 6,629,309 B1 * | 9/2003 | Allen, III ...................... 716/121 |
| 6,823,499 B1 | 11/2004 | Vasishta et al. |
| 6,877,144 B1 | 4/2005 | Rittman et al. |
| 6,904,582 B1 | 6/2005 | Rittman et al. |
| 7,114,145 B2 * | 9/2006 | Ye et al. .......................... 716/52 |
| 7,165,230 B2 | 1/2007 | Park |
| 7,222,325 B2 | 5/2007 | LaBerge |
| 7,260,807 B2 | 8/2007 | Shenoy et al. |
| 7,805,701 B1 * | 9/2010 | Xin-LeBlanc .................. 716/55 |
| 2002/0152435 A1 * | 10/2002 | Naksrikram et al. ......... 714/718 |

* cited by examiner

*Primary Examiner* — Binh Tat
(74) *Attorney, Agent, or Firm* — Alan A. R. Cooper; Wade J. Brady, III; Frederick J. Telecky, Jr.

(57) ABSTRACT

A spare logic circuit for implementing any one of a plurality of logic gates includes a multiplexer circuit whose select inputs are utilized as logic gate inputs, and whose output is utilized as a logic gate output. Each of a plurality of data inputs of the multiplexer circuit is configured to receive one of first and second logic voltage levels which define the desired logic function. By modifying a single photolithographic mask, the spare logic gate can be: configured to perform the desired logic function; connected into a target logic circuit; or both configured and connected into a target logic circuit.

8 Claims, 6 Drawing Sheets

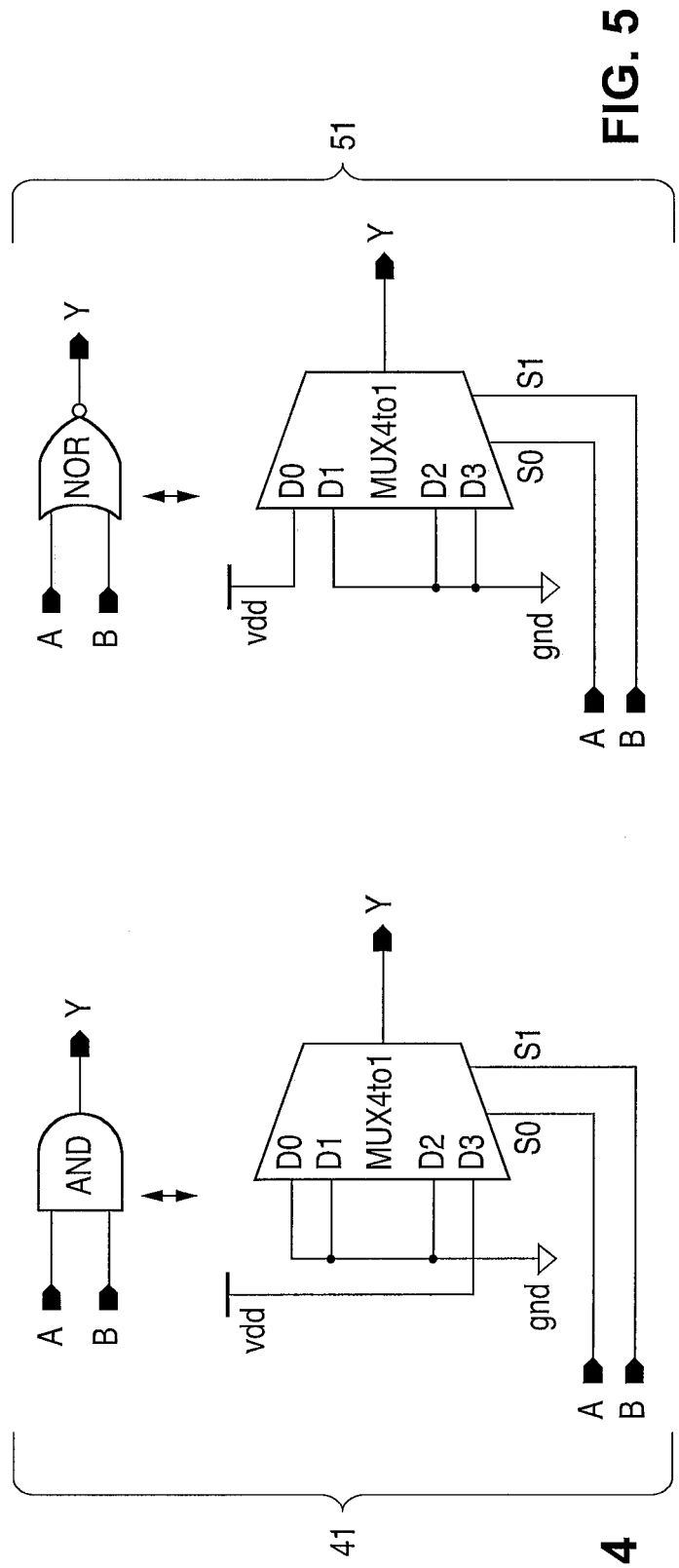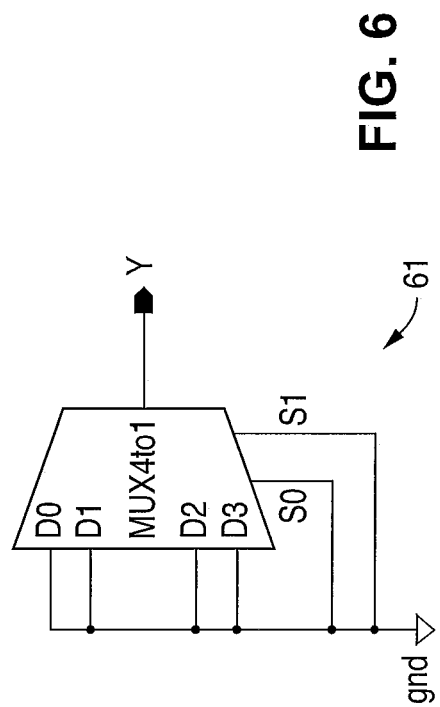
FIG. 4
FIG. 5
FIG. 6

UNIVERSAL TWO-INPUT LOGIC GATE THAT IS CONFIGURABLE AND CONNECTABLE IN AN INTEGRATED CIRCUIT BY A SINGLE MASK LAYER ADJUSTMENT

This application is a divisional of prior U.S. patent application Ser. No. 11/005,949 filed on Dec. 7, 2004 now U.S. Pat. No. 7,805,701.

TECHNICAL FIELD OF THE INVENTION

The invention relates generally to semiconductor integrated circuit manufacturing and, more particularly, to the accommodation of circuit design changes during the manufacturing process.

BACKGROUND OF THE INVENTION

During conventional semiconductor integrated circuit manufacturing (e.g., during VLSI manufacturing), it is occasionally necessary to modify a logic circuit design within the integrated circuit. It is therefore a common conventional practice to provide some spare logic gates, such as inverters, AND gates, NOR gates, etc., which can hopefully be used to make the desired modifications in the logic circuit design. Unfortunately, there is no way to insure that these spare gates will provide the particular logic functionality that is required to implement the desired change in the logic circuit design. For example, the spare gate may be a NAND gate, when the desired change in the logic circuit design calls for the insertion of a NOR gate.

Even if a spare logic gate is available to provide the logic functionality required by the desired change in the logic circuit design, the process of inserting the spare logic gate into the logic circuit design typically requires changing the photolithographic masks associated with at least one metal layer and one via layer of the integrated circuit. Modification of a photolithographic mask can be a relatively expensive operation in the integrated circuit manufacturing process.

SUMMARY OF THE INVENTION

To address the above-discussed deficiencies of the prior art, it is a primary object of the present invention to provide for a spare logic gate design that supports a wide range of logic functions and can be inserted into a target logic circuit design with minimal changes in the photolithographic mask set.

Exemplary embodiments of the invention provide a spare logic circuit for implementing any one of a plurality of logic gates. The select inputs of a multiplexer circuit are utilized as logic gate inputs, and the output of the multiplexer circuit is utilized as a logic gate output. Each of a plurality of data inputs of the multiplexer circuit is configured to receive one of first and second logic voltage levels which define the desired logic function.

By modifying a single photolithographic mask, exemplary embodiments of the invention can (1) configure a spare logic gate to perform a desired logic function, (2) connect a spare logic gate into a target logic circuit, or (3) both configure and connect a spare logic gate.

The foregoing has broadly outlined the features and technical advantages of the present invention so that those skilled in the art may better understand the detailed description that follows. Additional features and advantages of the invention will be described below that form the subject of the claims of the invention. Those skilled in the art will appreciate that they may readily use the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it is advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, cooperate with, be proximate to, be bound to or with, have a property of, or the like. The term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 1 is a truth table that illustrates sixteen (16) logic functions that can be performed by a two-input logic gate;

FIGS. 2 through 5 diagrammatically illustrate examples of two-input logic gates which can be implemented by various embodiments of the invention;

FIG. 6 diagrammatically illustrates a spare logic gate construction according to exemplary embodiments of the invention;

DETAILED DESCRIPTION OF THE INVENTION

Exemplary embodiments of the present invention provide a "universal" two-input spare logic gate which can be selectively configured to implement any desired one of all possible two-input logic functions. The spare logic gate can be laid out such that only a single metal mask layer change is needed for configuring and connecting the spare logic gate as desired.

Considering an arbitrary two-input logic gate, if A and B are the inputs, then there are sixteen (16) possible output combinations, Y0 through Y15. The input and output combinations are illustrated in the truth table of FIG. 1. For example, Y1 represents the logic function of an AND gate, Y8 represents the logic function of a NOR gate, and Y6 represents the logic function of an XOR gate. The truth table of FIG. 1 also provides the functionality of an inverter, for example A and Y12 can be the input and output, respectively, of an inverter.

Figures 1, 2, 3:
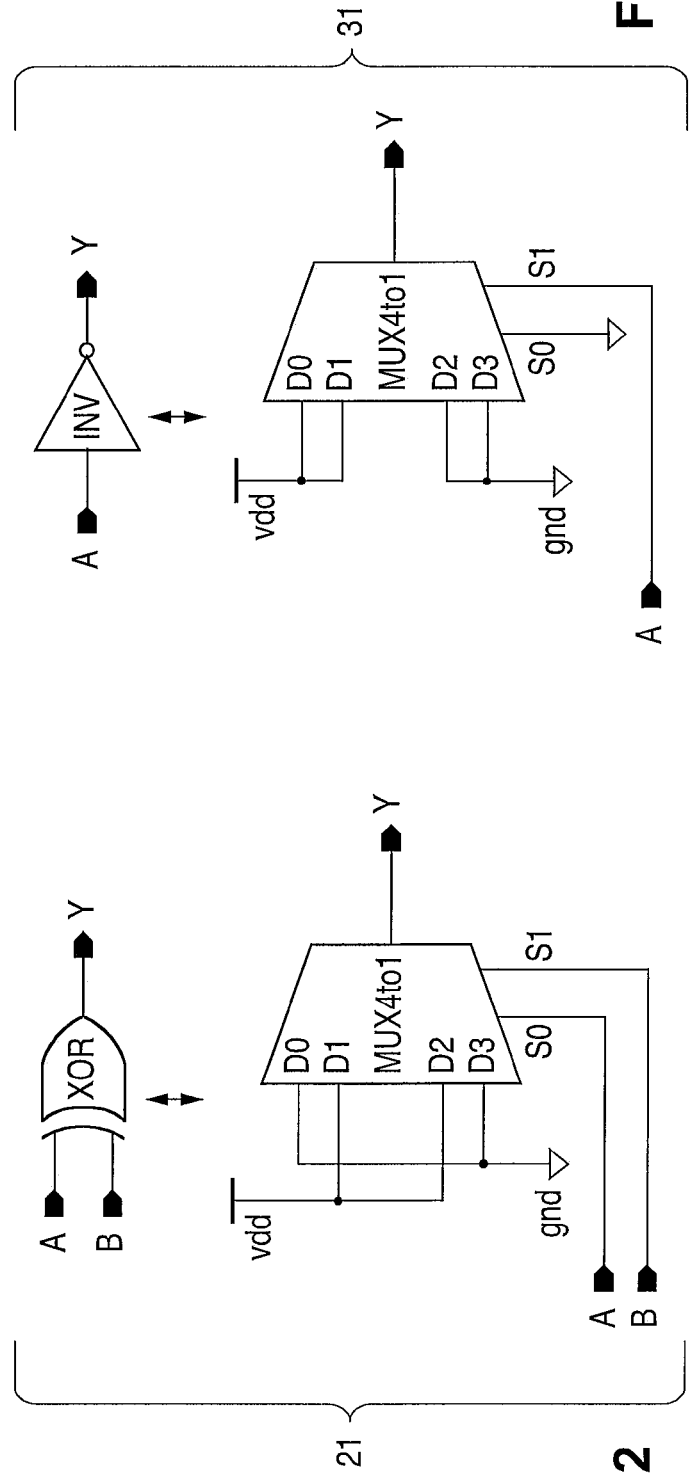

According to exemplary embodiments of the invention, the truth table of FIG. 1 can be implemented with a conventional 4-to-1 multiplexer circuit, with the multiplexer select inputs corresponding to the logic inputs A and B of FIG. 1, and with the multiplexer output corresponding to the logic outputs Y0 through Y15 of FIG. 1. The desired logic function is programmed by tying the data inputs of the multiplexer circuit to one of two possible logic levels, for example the positive supply voltage (Vdd) or the negative supply voltage (Vss). FIGS. 2, 3, 4 and 5 respectively illustrate XOR 21, inverter 31, AND 41, and NOR 51 functions produced by appropriately programming a 4-to-1 multiplexer circuit. In FIGS. 2 through 5, the multiplexer data inputs are designated D0, D1, D2 and D3, and the multiplexer select inputs are designated S0 and S1. Also in FIGS. 2 through 5, A and B represent the logic inputs of FIG. 1, and thus also designate the nodes of a target circuit that are to be connected to drive the inputs S0 and S1 of the spare logic gate. In the examples shown in FIGS. 2 through 5, the data inputs D0 through D3 are tied either to ground (Vss) or to the positive supply voltage (Vdd) in order to appropriately program the desired logic function. The D0 through D3 programming necessary to produce any of the logic functions illustrated in FIG. 1 can be readily determined by inspection of FIG. 1.

With a layout according to exemplary embodiments of the invention, it is possible to provide a 4-to-1 multiplexer circuit as a universal two-input spare logic gate that is configurable and connectable by modifying only a single photolithographic mask from among all of the metal and via layer masks in the photolithographic mask set that is utilized to produce the integrated circuit. To avoid standby current, all inputs of the spare 4-to-I multiplexer circuit, namely D0 through D3, S0 and S1 are tied to known logic levels when not in use. An example of this is shown in FIG. 6, where all inputs of the multiplexer circuit 61 are tied down to ground (Vss).

Figure 7:
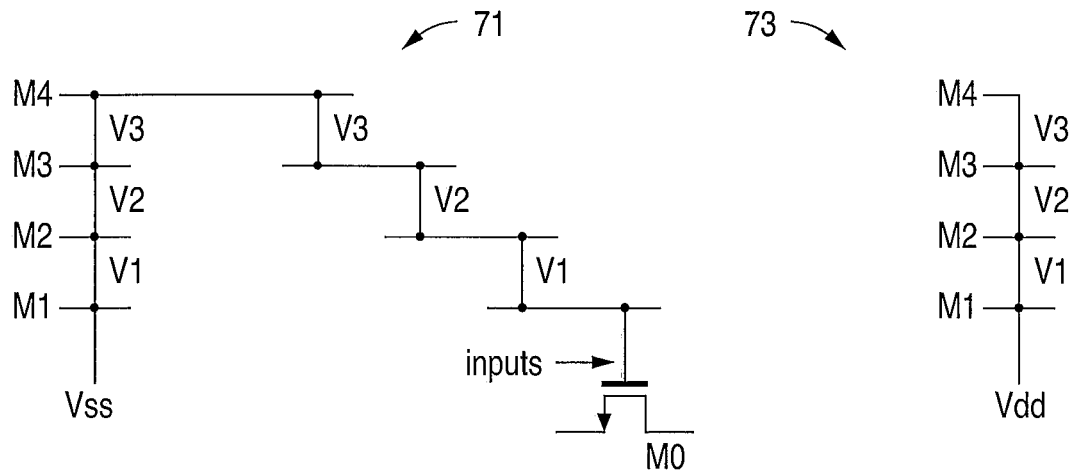
FIG. 7 diagrammatically illustrates the construction of a spare logic gate node and a power rail according to exemplary embodiments of the invention.

FIG. 7 diagrammatically illustrates an exemplary construction for each of the input nodes of FIG. 6 according to exemplary embodiments of the invention. Thus, each of the nodes D0 through D3, S0 and S1 of FIG. 6 can be constructed as shown at 71 in FIG. 7. The example of FIG. 7 assumes that the integrated circuit utilizes four metal layers M1 through M4 that are interconnected by vias in three via layers V1 through V3. Each of the input nodes of FIG. 6 is connected to Vss by the illustrated interconnection of metal layers and via layers.

More specifically, Vss at metal layer M1 is connected by via layer V1 to metal layer M2, which is in turn connected by via layer V2 to metal layer M3, which is in turn connected by via layer V3 to metal layer M4. Thus, each of the input nodes of the multiplexer circuit 61 of FIG. 6 is connected to Vss and is also connected to every metal layer utilized in the integrated circuit.

FIG. 7 also illustrates a power rail structure 73 according to exemplary embodiments of the invention. The power rail structure 73 uses via layers V1, V2 and V3 to connect the power supply Vdd at metal layer M1 to each of metal layers M2, M3 and M4. Thus, the power supply voltage Vdd is available at every metal layer, as are each of the input nodes of the multiplexer circuit (spare logic gate) 61. The input node and power-rail constructions 71 and 73 illustrated in FIG. 7 permit the spare logic gate 61 to be configured and connected as desired by modifying only a single photolithographic mask of the photolithographic mask set utilized to produce the integrated circuit.

Figure 8:
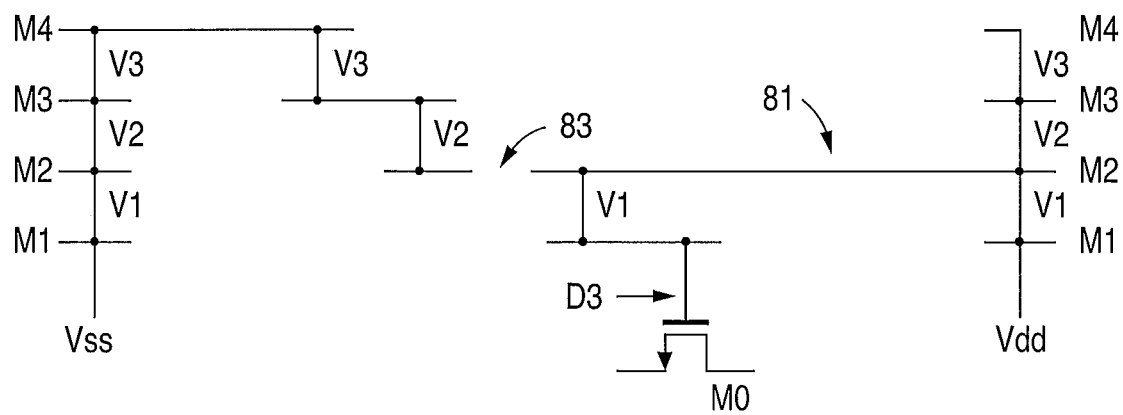
FIGS. 8 through 10 diagrammatically illustrate how exemplary embodiments of the invention can produce the logic gate of FIG. 4 from the spare logic gate of FIG. 6 by modification of a single photolithographic mask.
Figure 9:
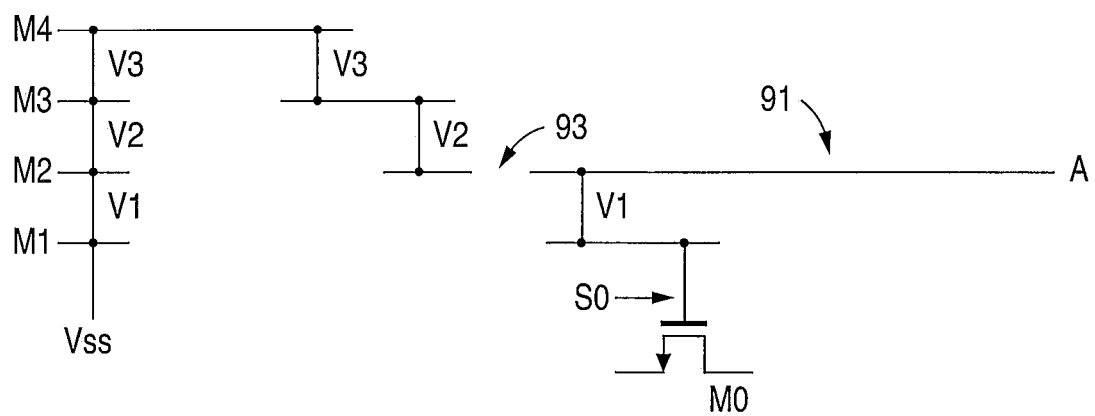
Figure 10:
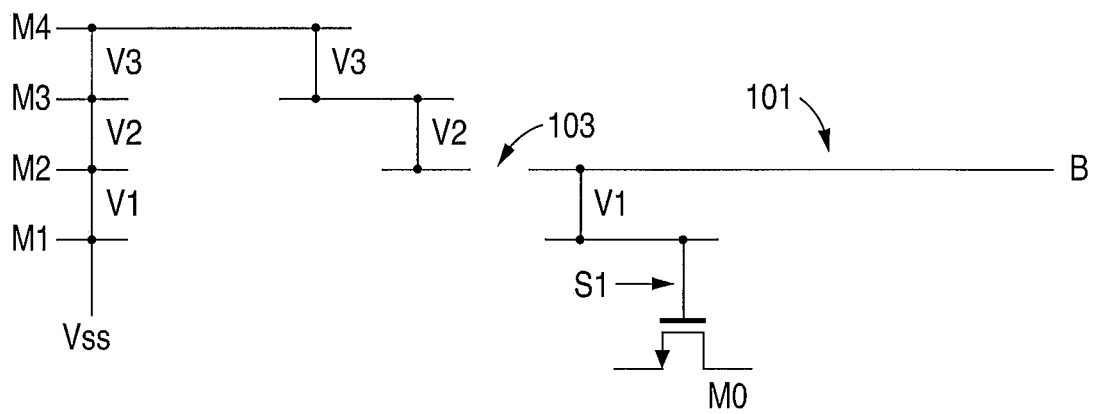

FIGS. 8 through 10 illustrate an example of how the spare logic gate 61 of FIG. 6 can be configured to perform an AND function as shown in FIG. 4, and can also be connected to a target logic circuit, by modifying only a single-photo-lithographic mask. The example of FIGS. 8 through 10 assumes that the target circuit nodes A and B, which will drive the select inputs S0 and S1 of FIG. 6, are defined in metal layer M2. Therefore, the photolithographic mask associated with metal layer M2 will be modified to configure and connect the spare logic gate 61 in the manner described hereinafter. In order to configure the spare logic gate 61 to perform the AND function, the construction of multiplexer data input D3 (see also FIGS. 4 and 6) must be modified to disconnect D3 from Vss, and also to connect D3 to the power supply voltage Vdd.

Accordingly, as shown in FIG. 8, the photo-lithographic mask associated with metal layer M2 is modified to form an open circuit 83 which disconnects input node D3 from Vss. Also, the photolithographic mask associated with metal layer M2 is modified to provide a connection 81 between the input node D3 and the power supply voltage Vdd, which power supply voltage Vdd is already available in metal layer M2 by virtue of the power rail structure 73 of FIG. 7.

Referring still to FIGS. 4 and 6, and also referring now to FIG. 9, the input node S0 can be disconnected from Vss by modifying the M2 photolithographic mask to provide an open circuit 93 as shown in FIG. 9. The input node S0 is also connected to the node A of the target circuit by modifying the M2 photolithographic mask to provide the connection 91 illustrated in FIG. 9.

Referring also to FIG. 10, the input node S1 can be disconnected from Vss by modifying the M2 photolithographic mask to provide an open circuit 103 as shown in FIG. 10. The input node S1 is connected to the node B of the target circuit by modifying the M2 photolithographic mask to provide the connection 101 illustrated in FIG. 10.

Thus, and considering the example of FIGS. 8 through 10 together with FIGS. 4 and 6, the spare logic gate 61 of FIG. 6 can be configured (FIG. 8) to perform the AND function and can be interconnected to the nodes A (FIG. 9) and B (FIG. 10) of a target circuit, by modifying only a single photolithographic mask, namely the mask associated with the M2 metal layer.

Figure 11:
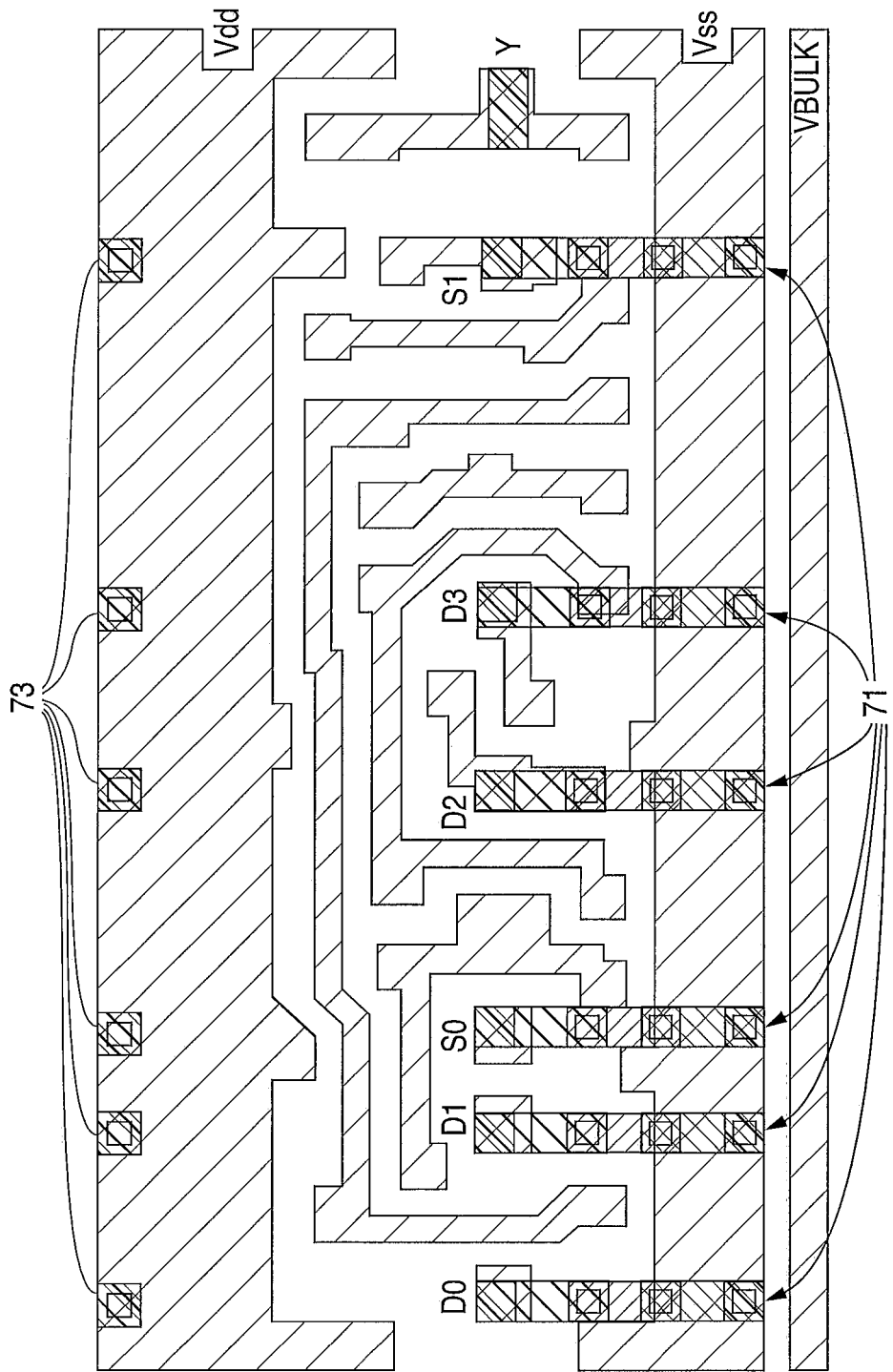
FIG. 11 illustrates a physical example of the structures represented in FIG. 7.
Figure 12:
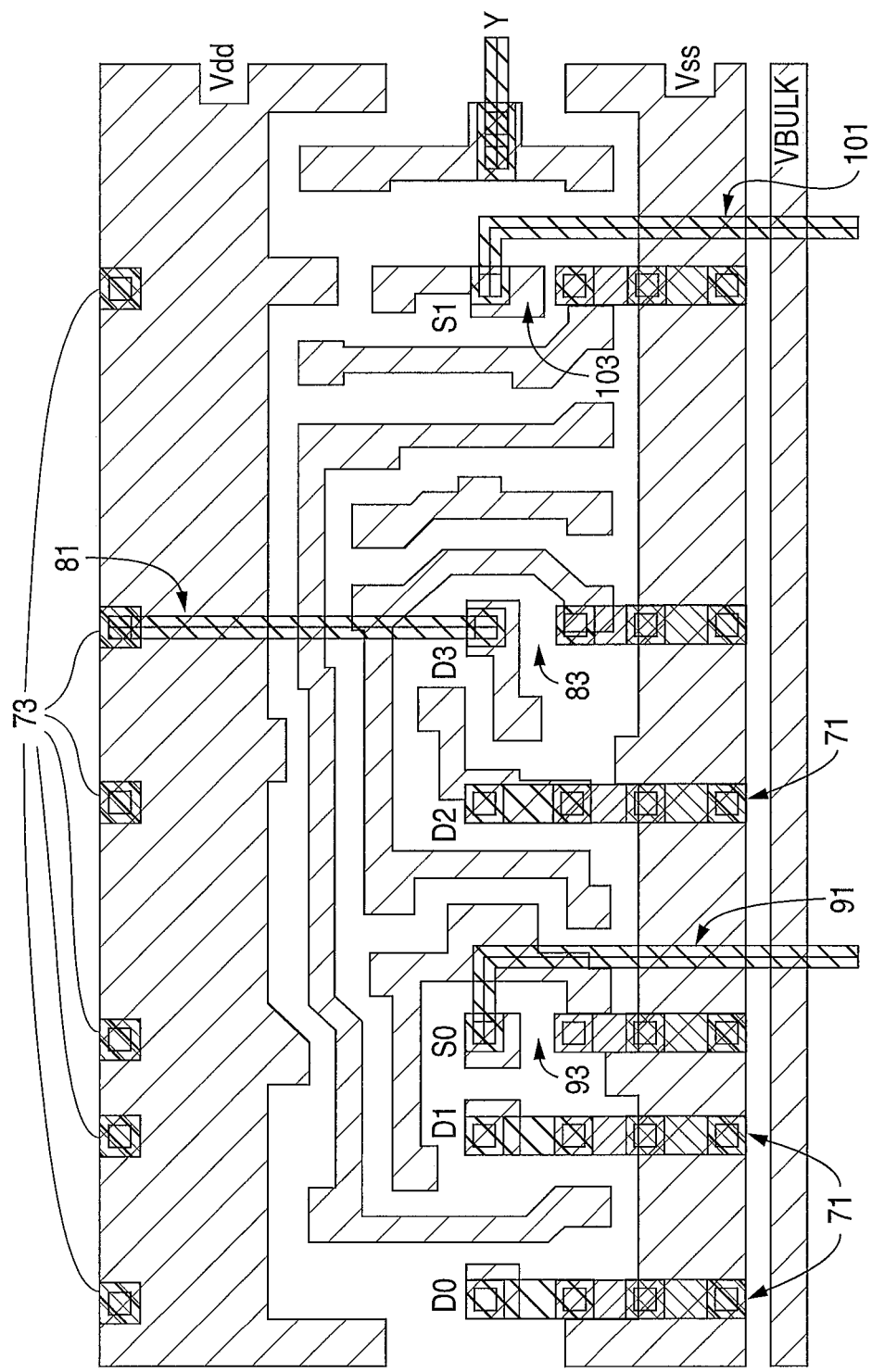
FIG. 12 illustrates a physical example of the structures represented in FIGS. 8 through 10.

FIG. 11 illustrates an example of the physical structures represented by FIG. 7, and FIG. 12 illustrates an example of the physical structures that result from FIG. 11 when the M2 photolithographic mask is modified to make the M2 metal layer changes illustrated in FIGS. 8 through 10.

Although the foregoing examples have been described with reference to the inputs of the multiplexer circuit 61 of FIG. 6, the output node of the multiplexer circuit 61 can also be constructed generally as shown at 71 in FIG. 7, and can be appropriately disconnected from Vss and connected to the target circuit in the same general fashion illustrated with respect to select inputs S0 and S1 of FIGS. 9 and 10.

Although the present invention has been described in detail, those skilled in the art should understand that they can make various changes, substitutions and alterations herein without departing from the spirit and scope of the invention in its broadest form.

What is claimed is:

1. A semiconductor integrated circuit apparatus, comprising:
   a spare logic gate comprising a first control input and multiple data inputs;
   a plurality of photographic masks, each correlated to one of a plurality of metal layers of the semiconductor integrated circuit; and
   wherein only one metal layer is to be modified of the plurality of metal layers;
   wherein a single photolithographic mask of the plurality of photographic masks is correlated to the one and only one metal layer to be modified, a and the one and only one metal layer to be modified is configured to be modified to:
   connect a node of a target logic circuit to the first control input; and
   connect at least one of the data inputs to a supply voltage,
   wherein no other metal layer other than the one and only one metal layer is configured to be modified to:
   connect the node of the target logic circuit to the first control input; and
   connect the at least one of the data inputs to the supply voltage,
   wherein the modification of the single photolithographic mask either removes or inserts from the one and only one metal layer a connection between one of the via layers and the first control input of the spare logic gate,
   wherein all other masks of the plurality of photographic masks associated with the plurality of metal layers do not have a removal or an insertion from any of the other of the plurality of metal layers, a connection between one of the via layers and the first control input of the spare logic gate, as a modification,
   wherein one of a plurality of alternative logic circuits are selected, by the removal or insertion of a connection from the one and only one metal layer correlated to the single photographic mask.

2. The apparatus of claim 1, wherein:
   the first control input and the data inputs are connected to a ground potential prior to modification of the single photolithographic mask; and
   the modification of the single photolithographic mask removes the connection of the first control input and at least one of the data inputs from the ground potential.

3. The apparatus of claim 1, further comprising:
   multiple via layers, each via layer connecting two of the metal layers of the multiple metal layers.

4. The apparatus of claim 3, wherein:
   the spare logic gate further comprises a second control input; and
   the modification of the single photolithographic mask inserts in the first one and only one metal layer a connection between one of the via layers and the second control input of the spare logic gate.

5. The apparatus of claim 3, wherein:
   the spare logic gate further comprises a second control input; and
   the modification of the single photolithographic mask removes from the one and only one metal layer a connection between one of the via layers and the second control input of the spare logic gate.

6. The apparatus of claim 1, wherein the spare logic gate comprises a 4-to-1 multiplexer circuit.

7. The apparatus of claim 6, wherein the 4-to-1 multiplexer circuit comprises two select inputs and four data inputs.

8. The apparatus of claim 1, wherein:
   the spare logic gate is configured to perform a selected one of a plurality of logic functions depending on which of the data inputs are connected to the supply voltage; and
   the modification of the single photolithographic mask configures the spare logic gate to perform the selected logic function.

* * * * *